United States Patent [19]

Terai

[11] Patent Number: 5,757,169

[45] Date of Patent: May 26, 1998

[54] ELECTRIC CIRCUIT FOR PULSE ENERGIZED ELECTROSTATIC PRECIPITATOR AND PULSE ENERGIZED ELECTROSTATIC PRECIPITATOR USING THIS CIRCUIT

[75] Inventor: Hiroshi Terai, Kanagawa-ken, Japan

[73] Assignee: Sumitomo Heavy Industries, Ltd., Tokyo, Japan

[21] Appl. No.: 803,357

[22] Filed: Feb. 20, 1997

[30] Foreign Application Priority Data

Feb. 29, 1996 [JP] Japan .................................. 8-043798
Oct. 4, 1996 [JP] Japan .................................. 8-264755

[51] Int. Cl.[6] .......................... G05F 1/40; G05F 1/455; H02M 5/45
[52] U.S. Cl. .......................... 323/241; 323/242; 323/246; 323/903; 363/37; 363/128
[58] Field of Search ..................... 363/109, 34, 37, 363/63, 128, 98, 132, 48, 139, 27; 323/242, 246, 240, 271, 282, 903, 241; 361/235, 214, 229

[56] References Cited

U.S. PATENT DOCUMENTS 4,107,757  8/1978  Masuda et al. ...................... 361/235
4,558,404  12/1985 James ................................. 363/37
4,665,476  5/1987  Masuda .............................. 363/86

*Primary Examiner*—Stuart N. Hecker
*Assistant Examiner*—Rajnikant B. Patel
*Attorney, Agent, or Firm*—Frishauf, Holtz, Goodman, Langer & Chick

[57] ABSTRACT

An electrostatic precipitator circuit has an input terminal supplied DC voltage, an output terminal connected to a precipitating capacitor, a storage capacitor connected between ground potential and the input terminal, and a recovery capacitor whose one electrode is applied with ground potential. The circuit further includes a current path switching unit having a common terminal and first and second switch terminals to be connected to the common terminal, the common terminal being connected to a non-ground electrode of the storage capacitor. The circuit further includes a first current path having a serial circuit of an inductor and a diode for connecting the first switch terminal to the output terminal, a second current path having a serial circuit of an inductor and a diode for connecting the output terminal to the non-ground electrode of the recovery capacitor, and a third current path having a serial circuit of an inductor and a diode for connecting the non-ground electrode of the recovery capacitor to the second switch terminal.

17 Claims, 6 Drawing Sheets

5,757,169

ELECTRIC CIRCUIT FOR PULSE ENERGIZED ELECTROSTATIC PRECIPITATOR AND PULSE ENERGIZED ELECTROSTATIC PRECIPITATOR USING THIS CIRCUIT

BACKGROUND OF THE INVENTION

1) Field of the Inventikon

The present invention relates to an electrostatic precipitator, particularly to a pulse energized electrostatic precipitator.

A pulse energizing system for an electrostatic precipitator is very effective for compacting a precipitator. However, a pulse energizing system is usually expensive. The cost of an electrostatic precipitator, particularly a precipitator of a middle scale or smaller, is not so high. Therefore, in many cases, the merit of compacting the precipitator is cancelled out by the demerit of increased cost for the pulse energizing system. Reducing the cost of a pulse energizing system has long been desired.

2) Description of the Related Art

One type of a pulse power source for an electrostatic precipitator uses a semiconductor device such as a thyristor as a switching element, and the other type uses a rotary spark gap.

A conventional pulse power source using a rotary spark gap will be described with reference to FIGS. 5A and 5B. FIG. 5A shows the circuit structure of a pulse power source, and FIG. 5B shows the voltage waveform of the pulse power source.

Referring to FIG. 5A, an AC current is supplied from an AC power source to a transformer and a diode bridge to generate a DC current source. The positive output terminal of the DC current source is grounded and the negative output terminal is connected via an impedance Z to one still electrode of a rotary spark gap $RSG_3$.

The interconnection between the impedance Z and the rotary spark gap $RSG_3$ is connected to one electrode of a storage capacitor $C_s$ and the other electrode thereof is grounded.

The rotary spark gap $RSG_3$ forms spark gaps between still electrodes and rotary electrodes which are rotated by a motor M. The other still electrode of the rotary spark gap $RSG_3$ is connected via an inductor $L_{10}$ to one multiple system of electrodes (called discharging electrodes) of a precipitating capacitor EP, whose other multiple system of electrodes (called collecting electrodes) is grounded.

When the rotary spark gap $RSG_3$ becomes conductive, an LC resonance circuit is formed by the storage capacitor $C_s$, inductor $L_{10}$, and precipitating capacitor EP. Negative charges stored in the storage capacitor $C_s$ excite resonance current in the LC resonance circuit.

FIG. 5B shows the electrical characteristics of the rotary spark gap type pulse power source shown in FIG. 5A. The abscissa represents time t and the ordinate represents negative voltage at the precipitating capacitor EP. During the period while the rotary spark gap $RSG_3$ becomes conductive, current having a resonance frequency oscillation to the LC resonance circuit is excited. In the waveform shown in FIG. 5B, the oscillation period is several hundreds µs during which period several cycles of oscillation are generated.

When the rotary spark gap $RSG_3$ becomes non-conductive, resonance current will not flow through the LC resonance circuit and oscillation stops. If a voltage of the precipitating capacitor EP at this time is higher than the corona discharge start voltage in absolute value electric charges in the precipitating capacitor EP are reduced by the corona discharge and the negative voltage of the precipitating capacitor EP lowers exponentially.

The rotary spark gap pulse power source having the circuit structure shown in FIG. 5A cannot generate a single pulse, but generates a multi-pulse waveform having oscillation of several cycles until the rotary spark gap $RSG_3$ becomes non-conductive.

A voltage waveform desired by an electrostatic precipitator is a single pulse of a high negative voltage in each separate period and a constant negative voltage called a base voltage during the rest of period. The voltage waveform shown in FIG. 5B is therefore not suitable for a pulse waveform for an electrostatic precipitator.

FIG. 5C shows an electronic circuit made of a thyristor and a diode capable of replacing the rotary spark gap $RSG_3$ shown in FIG. 5A. This circuit is a parallel circuit of the thyristor $S_{10}$ and diode $D_{10}$ inversely connected. In an actual case, the thyristor $S_{10}$ is formed by a number of serially connected thyristor elements so that a high withstand voltage is ensured.

As the thyristor $S_{10}$ becomes conductive, similar to the rotary spark gap $RSG_3$ shown in FIG. 5A, resonance current is excited in the LC resonance circuit. After current flows through the thyristor $S_{10}$ in a forward direction, current flows through the diode $D_{10}$ in a forward direction. When the thyristor $S_{10}$ is made non-conductive during the period while current flows through the diode $D_{10}$, the resonance current of about one period flows and thereafter it stops.

In an actual case, however, some of a number of thyristor elements constituting the thyristor $S_{10}$ don't become fully non-conductive and the thyristor $S_{10}$ as a whole cannot withstand a high voltage and all the thyristor elements become conductive. Therefore, an oscillation waveform like that shown in FIG. 5B is formed in practice. Thyristors are more expensive than a rotary spark gap.

FIG. 6 is a circuit diagram of an electrostatic precipitator disclosed as an embodiment of JP-A-6-343898 proposed by the present inventors so as to solve the above problem. A diode $D_{12}$ is serially connected to a rotary spark gap $RSG_4$, and a diode $D_{13}$ is connected in parallel to a serial circuit of the rotary spark gap $RSG_4$ and diode $D_{12}$, the diode $D_{13}$ having the polarities opposite to the diode $D_{12}$.

Since the diodes $D_{12}$ and $D_{13}$ are inversely connected in parallel, excited resonance current flows through the diode $D_{12}$ during a half cycle and through the diode $D_{13}$ during the other half cycle.

During the half cycle while the resonance current flows through the diode $D_{13}$, current will not flow through the rotary spark gap $RSG_4$. During this cycle, arc plasma generated at the rotary spark gap $RSG_4$ extinguishes. In order to fully extinguish arc plasma, air may be blown on a gap where arc plasma is generated.

With the circuit structure shown in FIG. 6, it becomes possible to make the rotary spark gap $RSG_4$ non-conductive at the timing after the resonance current flows during one half cycle. However, as a forward voltage appears thereafter across the diode $D_{12}$ by oscillations of the LC resonance circuit, the rotary spark gap $RSG_4$ sparks again.

In order to prevent re-spark, before the second forward voltage appears across the diode $D_{12}$, the rotary electrodes of the rotary spark gap $RSG_4$ are rotated by a sufficient angle to obtain a gap length not allowing spark. One method of realizing this is to set the speed at the distal end of the rotary electrode to several hundreds m/s.

It is difficult to manufacture a rotary spark gap capable of rotating at such a high speed. Moreover, a drive power increases and the speed at the distal end of the rotary electrode is faster than a sound speed so that large noises are produced.

SUMMARY OF THE INVENTION

It is an object of the present invention to provide a circuit for an electrostatic precipitator capable of generating a pulse waveform suitable for the precipitator without re-spark even at a low revolution rate, while using a low cost rotary spark gap.

According to one aspect of the present invention, there is provided an electrostatic precipitator circuit comprising: an input terminal to which a DC voltage is applied; an output terminal to be connected to a precipitating capacitor having a multiple system of discharging electrodes and a multiple system of collecting electrodes; a storage capacitor whose one electrode is applied with the ground potential and the other electrode is connected to the input terminal; a recovery capacitor whose one electrode is applied with the ground potential; current path switching means having a common terminal and first and second switch terminals, the common terminal being connected to a non-ground electrode of the storage capacitor, and the current path switching means taking a first conductive state of connecting the common terminal to the first switch terminal, a second conductive state of connecting the common terminal to the second switch terminal, and a neutral state of connecting the common terminal neither to the first nor to the second switch terminal; a first current path including a serial circuit of a first inductor and a first diode for connecting the first switch terminal to the output terminal; a second current path including a serial circuit of a second inductor and a second diode for connecting the output terminal to a non-ground electrode of the recovery capacitor, the polarity of the electrode of the second diode on the side of the output terminal being opposite to the polarity of the electrode of the first diode on the side of the output terminal; and a third current path including a serial circuit of a third inductor and a third diode for connecting the non-ground electrode of the recovery capacitor to the second switch terminal, the polarity of the electrode of the third diode on the side of the recovery capacitor being opposite to the polarity of the electrode of the second diode on the side of the recovery capacitor.

The storage capacitor is charged from the input terminal. As the current path switching means is made to enter the first conductive state, electric charges in the storage capacitor move along the first current path into the precipitating capacitor connected to the output terminal. Since the first diode is connected at the first current path, electric charges in the precipitating capacitor will not move back to the storage capacitor. The electric charges accumulated in the precipitating capacitor move along the second current path into the recovery capacitor. Since the second diode is connected at the second current path, electric charges in the recovery capacitor will not move back to the precipitating capacitor.

During the period while current does not flow through the first current path, the current path switching means is made to enter the neutral state. After the distance between terminals for the first conductive state becomes so long that re-spark will not occur, the current path switching means is made to enter the second conductive state. Therefore, electric charges in the recovery capacitor are moved back to the storage capacitor via the third current path. Since the third diode is connected at the third current path, the electric charges sent back to the storage capacitor will not move back to the recovery capacitor.

According to another aspect of the present invention, there is provided an electrostatic precipitator circuit comprising: an input terminal to which a DC voltage is applied; an output terminal to be connected to a precipitating capacitor; a storage capacitor whose one electrode is applied with ground potential and other electrode is connected to the input terminal; a recovery capacitor whose one electrode is applied with the ground potential; a first current path including switching means and a serial circuit of a first inductor and a first diode for connecting a non-ground electrode of the storage capacitor to the output terminal; a second current path including a serial circuit of a second inductor and a second diode for connecting the output terminal to a non-ground electrode of the recovery capacitor, the polarity of the electrode of the second diode on the side of the output terminal being opposite to the polarity of the electrode of the first diode on the side of the output terminal; and a resistor connected in parallel to the second diode.

The storage capacitor is charged from the input terminal. As the switching means is closed, electric charges in the storage capacitor move along the first current path into the precipitating capacitor connected to the output terminal. Electric charges which moved into the precipitating capacitor will not move back to the storage capacitor but are recovered via the second current path by the recovery capacitor. Electric charges recovered by the recovery capacitor gradually leak to the precipitating capacitor via the resistor. This leak current charges the precipitating capacitor and gradually increases the absolute value of the voltage at the precipitating capacitor. On the other hand, corona discharge occurs at the precipitating capacitor so that the voltage at the precipitating capacitor takes a value balancing the leak current and corona discharge current.

According to another aspect of the present invention, there is provided an electrostatic precipitator comprising: a DC power source switched between a voltage output state and a voltage output inhibition state upon reception of an on-off control signal; a precipitating capacitor whose one multiple system of electrodes is applied with ground potential, the precipitating capacitor having a multiple system of discharging electrodes and a multiple system of collecting electrodes; a storage capacitor whose one electrode is applied with the ground potential and the other electrode is applied with an output voltage of the DC power source; a recovery capacitor whose one electrode is applied with the ground potential; current path switching means having a common terminal and first and second switch terminals, the common terminal being connected to a non-ground electrode of the storage capacitor, and the current path switching means taking a first conductive state of connecting the common terminal to the first switch terminal, a second conductive state of connecting the common terminal to the second switch terminal, and a neutral state of connecting the common terminal neither to the first nor to the second switch terminal; a first current path including a serial circuit of a first inductor and a first diode for connecting the first switch terminal to a non-ground electrode of the precipitating capacitor; a second current path including a serial circuit of a second inductor and a second diode for connecting a non-ground electrode of the precipitating capacitor to a non-ground electrode of the recovery capacitor, the polarity of the electrode of the second diode on the side of the precipitating capacitor being opposite to the polarity of the electrode of the first diode on the side of the precipitating capacitor; a third current path including a serial circuit of a third inductor and a third diode for connecting the non-ground electrode of the recovery capacitor to the second switch terminal, the polarity of the electrode of the third diode on the side of the recovery capacitor being opposite to the polarity of the electrode of the second diode on the side of the recovery capacitor; and control means for making the current path switching means enter the first conductive state after making said DC power source enter the voltage output inhibition state, and after a lapse of a half cycle of the resonance frequency of an LC resonance circuit formed by the precipitating capacitor, the storage capacitor, and the first current path from time when the current path switching means is made to enter the first conductive state, for making the current path switching means enter the neutral state, and after a lapse of a half cycle of the resonance frequency of an LC resonance circuit formed by the precipitating capacitor, the recovery capacitor, and the second current path from time when the current path switching means is made to enter the neutral state, for making after a lapse of some time the current path switching means enter the second conductive state, and thereafter for making the DC power source enter the voltage output state.

Electric charges accumulated in the precipitating capacitor are not moved back to the DC power source side, but are temporarily recovered by the recovery capacitor. Accordingly, after a single pulse voltage is applied to the precipitating capacitor, the circuit for applying a pulse voltage can be opened easily. It is therefore possible to apply a voltage waveform near an ideal waveform for a precipitating capacitor.

DETAILED DESCRIPTION OF THE PREFERRED EMBODIMENTS

Figure 1A:
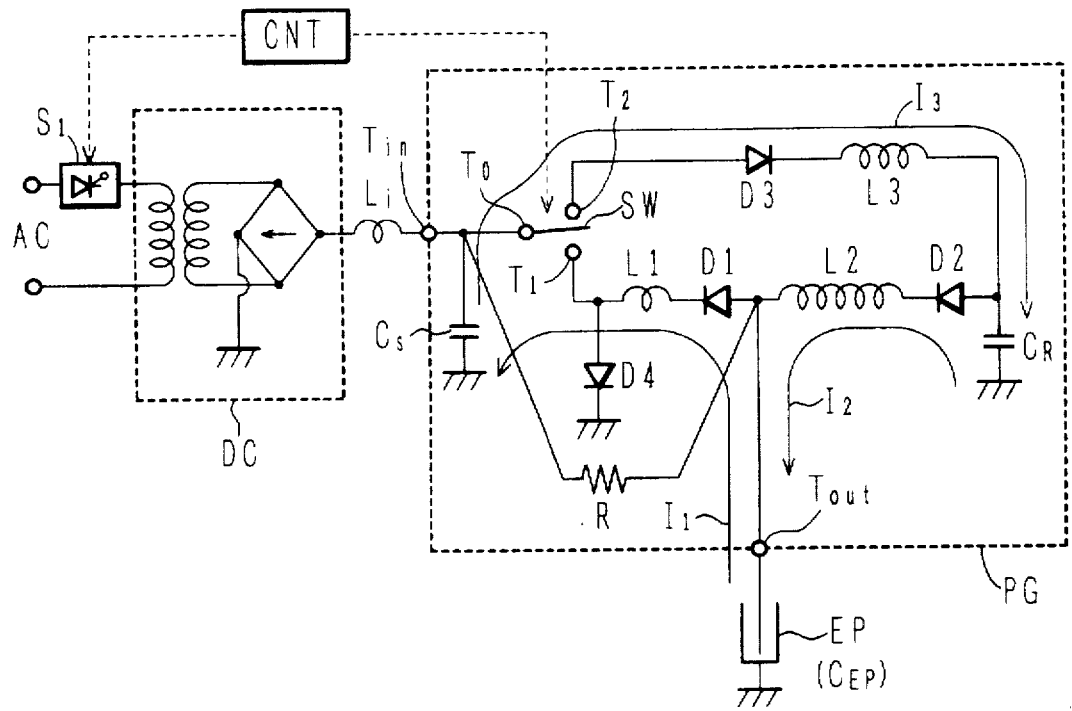
FIG. 1A shows a circuit for an electrostatic precipitator, including its peripheral circuit and a precipitating capacitor, according to a first embodiment of the invention.

FIG. 1A shows a circuit for an electrostatic precipitator, including its peripheral circuit and a precipitating capacitor, according to the first embodiment of the invention. A DC power source is formed by a transformer and a diode bridge connected to the secondary winding of the transformer. The primary winding of the transformer is connected via a thyristor $S_1$ to an AC power source. The thyristor $S_1$ is controlled by a timing controller CNT. The positive output terminal of the DC power source is grounded, and the negative output terminal thereof is connected via an inductor $L_i$ to a power input terminal $T_{in}$ of an electrostatic precipitator circuit PG.

A precipitating capacitor EP of the electrostatic precipitator comprises a multiple system of collecting plate electrodes and a multiple system of discharging rod electrodes disposed spaced apart from the collecting electrode by a predetermined distance. Gas such as air to be precipitated flows between each collecting electrode and discharging electrode. The collecting electrodes are grounded and the discharging electrodes are connected to a power output terminal $T_{out}$ of the electrostatic precipitator circuit PG. The precipitating capacitor EP has an electrostatic capacitance $C_{EP}$.

The electrostatic precipitator circuit PG is formed by a storage capacitor $C_S$ whose one terminal is grounded, a recovery capacitor $C_R$, and a current paths connecting between these capacitors or between these capacitors and output terminal $T_{out}$.

The storage capacitor $C_S$ is connected between the input terminal $T_{in}$ and ground, and charged by a DC voltage applied to the input terminal $T_{in}$. The other terminal not grounded of the storage capacitor $C_S$ is connected to a common terminal $T_o$ of a switch SW. The switch SW has two switch terminals $T_1$ and $T_2$ connectable to the common terminal $T_o$, and is controlled by the timing controller CNT.

The first switch terminal $T_1$ of the switch SW is connected to the output terminal $T_{out}$ via a serial circuit of an inductor $L_1$ and a diode $D_1$. The diode $D_1$ has its forward direction set so that current flows from the output terminal $T_{out}$ to the switch SW.

The output terminal $T_{out}$ is connected to the non-ground electrode of the recovery capacitor $C_R$ via a serial circuit of an inductor $L_2$ and a diode $D_2$. The diode $D_2$ has its forward direction set in such a manner that current flows from the recovery capacitor $C_R$ to the output terminal $T_{out}$.

The non-ground electrode of the recovery capacitor $C_R$ is connected to the second switch terminal $T_2$ of the switch SW via a serial circuit of an inductor $L_3$ and a diode $D_3$. The diode $D_3$ has its forward direction set in such a manner that current flows from the second switch terminal $T_2$ to the recovery capacitor $C_R$.

The non-ground electrode of the storage capacitor $C_S$ is connected via a resistor R to the output terminal $T_{out}$. The resistance of the resistor R is several tens MΩ. In a normal operation state, current scarcely flows through this resistor R. The interconnection between the inductor $L_1$ and switch SW is grounded via a diode $D_4$. In a normal operation state, current does not flow through the diode $D_4$ because the interconnection between the inductor $L_1$ and switch SW takes a negative voltage.

As the switch SW is turned to the first switch terminal $T_1$ side, an LC resonance circuit $I_1$ is formed which is constituted of the storage capacitor $C_S$, inductor $L_1$, and precipitating capacitor EP. As the switch SW is turned to the second switch terminal $T_2$ side, an LC resonance circuit $I_3$ is formed which is constituted of the storage capacitor $C_S$, inductor $L_3$, and recovery capacitor $C_R$. An LC resonance circuit $I_2$ is formed by the precipitating capacitor EP, inductor $L_2$, and recovery capacitor $C_R$.

The storage capacitor $C_S$, recovery capacitor $C_R$, and precipitating capacitor EP have generally the same capacitance. The inductance of the inductor $L_1$ is selected so that, for example, a half cycle $T_1$ of the resonance frequency of the LC resonance circuit $I_1$ is about 10 μs. Namely, the inductance is selected so as to satisfy the following equation.

$$T_1 = \pi(L_1 C_S C_{EP}/(C_S + C_{EP}))^{1/2} \cong 10 \ \mu s.$$

The inductance of the inductor $L_2$ is selected so that, for example, a half cycle $T_2$ of the resonance frequency of the LC resonance circuit $I_2$ is about 100 μs. Namely, the inductance is selected so as to satisfy the following equation.

$$T_2 = \pi(L_2 C_{EP} C_R/(C_{EP} + C_R))^{1/2} \cong 100 \ \mu s.$$

The inductance of $L_2$ is about 100 times as large as that of $L_1$.

Next, the operation of the circuit shown in FIG. 1A will be described with reference to FIG. 1B.

Figure 1B:
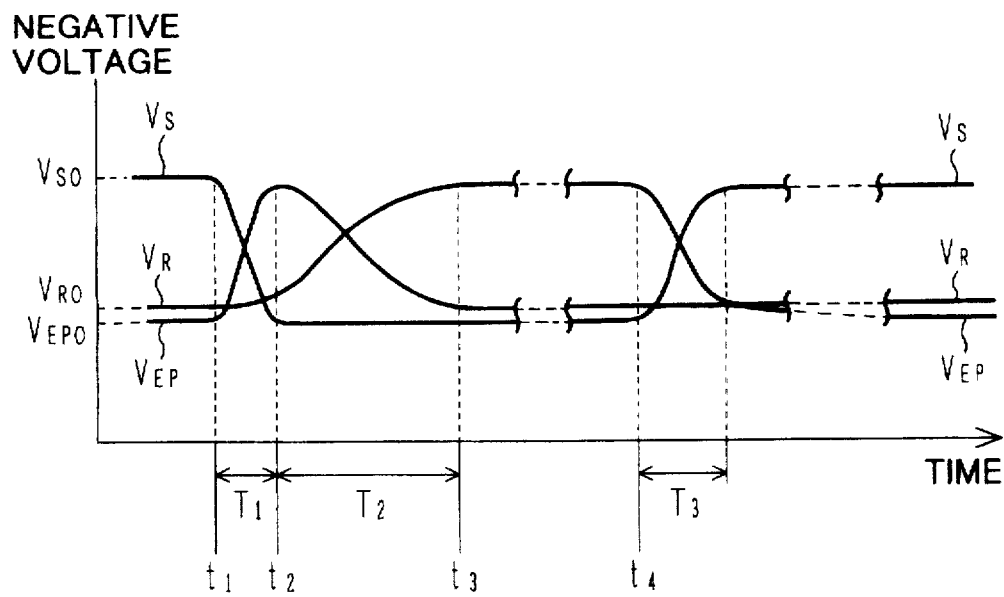
FIG. 1B is a graph showing a voltage change with time of the circuit shown in FIG. 1A.

FIG. 1B is a graph showing a voltage change with time at the non-ground terminals of the storage, recovery, and precipitating capacitors of the electrostatic precipitator circuit PG shown in FIG. 1A. The abscissa represents time, and the ordinate represents negative voltage. Curves $V_S$, $V_{EP}$, and $V_R$ represent voltages across the electrodes of the storage, precipitating, and recovery capacitors $C_S$, EP, and $C_R$, respectively.

Before time t1, the switch SW is non-conductive. The storage capacitor $C_S$ has been charged to an output voltage of the DC power source and takes a voltage $V_s$ as its initial value $V_{SO}$. The absolute value of this voltage is larger than the corona discharge start voltage of the precipitating capacitor EP. Negative charges have been stored in the precipitating capacitor EP until time t1. Since the negative charges are lost by corona discharge, the voltage $V_{EP}$ is approximately equal to the corona discharge start voltage and takes an initial value $V_{EPO}$ in a steady state.

As the $V_R$ becomes higher (smaller in absolute value) than the voltage $V_{EP}$, the diode $D_2$ becomes conductive so that current flows from the recovery capacitor $C_R$ to the precipitating capacitor EP. Therefore, the voltage VR becomes slightly lower (larger in absolute value) than the voltage $V_{EP}$ and takes an initial value $V_{RO}$.

The timing controller CNT makes the thyristor SI non-conductive immediately before time t1.

At time t1, the timing controller CNT turns the switch SW to the first switch terminal $T_1$ side. The LC resonance circuit $I_1$ is therefore established and forward current flows through the diode $D_1$, i.e., electric charges stored in the storage capacitor $C_S$ move into the precipitating capacitor EP. Therefore, the absolute value of the voltage $V_S$ reduces and the absolute value of the voltage $V_{EP}$ increases. Since the capacitance of the storage capacitor $C_S$ and the capacitance $C_{EP}$ of the precipitating capacitor EP are generally the same, an increase amount of the absolute value of the voltage $V_{EP}$ is generally the same as a decrease amount of the absolute value of the voltage $V_S$.

Assuming that there is no energy loss by resistors, at time t2 after a lapse of a half cycle $T_1$ of the resonance frequency of the LC resonance circuit $I_1$, the absolute value of the voltage $V_S$ reduces to the initial value $V_{EPO}$ of the voltage $V_{EP}$ and the absolute value of the voltage $V_{EP}$ increases to the initial value $V_{SO}$ of the voltage $V_S$. At time t2 although current tends to flow in a reverse direction, reverse current will not flow because of the diode $D_1$.

As the absolute value of the voltage $V_{EP}$ becomes larger than the absolute value of the voltage $V_R$, the diode $D_2$ becomes conductive so that part of negative charges stored in the precipitating capacitor EP moves into the recovery capacitor $C_R$. However, since the half cycle $T_2$ of the resonance frequency of the LC resonance circuit $I_2$ is about ten times as long as the half cycle $T_1$ of the resonance frequency of the LC resonance circuit $I_1$, the rise time of resonance current excited by the LC resonance circuit $I_2$ is much longer than the time $T_1$. Therefore, a change in the voltage $V_{EP}$ to be caused by current flowing in the LC resonance circuit $I_2$ during the period from t1 to t2, is very small or negligible.

After time t2, current does not flow in the LC resonance circuit $I_1$ and flows only in the LC resonance circuit $I_2$. Namely, negative charges stored in the precipitating capacitor EP move into the recovery capacitor $C_R$. Therefore, the absolute value of the voltage $V_{EP}$ reduces and the absolute value of the voltage $V_R$ increases. Since the capacitances of the precipitating capacitor EP and recovery capacitor $C_R$ are generally the same, a decrease amount of the absolute value of the voltage $V_{EP}$ is generally the same as an increase amount of the absolute value of the voltage $V_R$.

Assuming that there is no energy loss by resistors, the absolute value of the voltage $V_{EP}$ reduces to the initial value $V_{RO}$ of the voltage $V_R$ and the absolute value of the voltage $V_R$ increases to the initial value $V_{SO}$ of the voltage $V_s$. At time t3 after a lapse of a half cycle $T_2$, a reverse bias is generated at the diode $D_2$ so that current does not flow. At this time, the absolute value of the voltage $V_{EP}$ lowers to a value $V_{RO}$ near its initial value $V_{EP\ O}$ so that the trailing edge of the pulse waveform of the voltage $V_{EP}$ becomes sharp and the base voltage becomes generally flat.

After time t2, the timing controller CNT sets the switch SW to a neutral position. Since current does not flow through reversely biassed diode $D_1$ at this time, the switch SW can be easily made non-conductive.

Since the thyristor $S_1$ is non-conductive after time t1, the voltage $V_s$ does not change taking approximately its initial value $V_{EP\ O}$, after time t2. Since both the diodes $D_1$ and $D_2$ are non-conductive after time t3, both the voltages $V_{EP}$ and $V_R$ maintain to be generally constant.

At time t4, the timing controller CNT turns the switch SW to the second switch terminal $T_2$ side. The LC resonance circuit $I_3$ is therefore established and forward current flows through the diode $D_3$. Namely, electric charges stored in the recovery capacitor $C_R$ move into the storage capacitor $C_S$. Therefore, the absolute value of the voltage $V_R$ reduces and the absolute value of the voltage $V_S$ increases.

Since the capacitances of the storage capacitor $C_S$ and recovery capacitor $C_R$ are generally the same and the voltage $V_S$ maintains to be approximately the initial value $V_{EP\ O}$ after time t2, the absolute value of the voltage $V_R$ reduces near to the initial value $V_{EP\ O}$ assuming that there is no loss by resistors. This value is the initial value $V_{RO}$ of the next pulse. The absolute value of the voltage $V_S$ increases near to the initial value $V_{SO}$.

The absolute value of the voltage $V_{EP}$ gradually reduces superposing upon the above-described voltage change, because of the corona discharge between the electrodes of the precipitating capacitor EP after time t1. Therefore, after a lapse of sufficient time after time t4+$T_3$, the voltage $V_{EP}$ becomes generally the same as the corona discharge start voltage.

After time t4+$T_3$, the timing controller CNT makes the thyristor $S_1$ conductive. If the absolute value of the voltage $V_S$ is smaller than the initial value $V_{SO}$, the storage capacitor $C_S$ is charged by the DC power source and the voltage $V_S$ recovers the initial value $V_{SO}$. In this manner, the voltages $V_S$, $V_{EP}$, and $V_R$ return to the initial state at time t1.

The diode $D_4$ shown in FIG. 1A prevents the storage capacitor $C_S$ from being charged in the reverse polarity by abnormal oscillations when spark is generated in the precipitating capacitor EP. The resistor R operates to make the voltage $V_{EP}$ recover the base voltage in several seconds after spark is generated in the precipitating capacitor EP.

The voltage $V_{EP}$ shown in FIG. 1B has a waveform of a negative pulse voltage during the period from time t1 to time t3, superposed upon a DC base voltage approximately equal to the corona discharge start voltage. In the first embodiment, a single pulse voltage generally ideal to a pulse energized electrostatic precipitator can therefore be generated intermittently.

Figure 2:
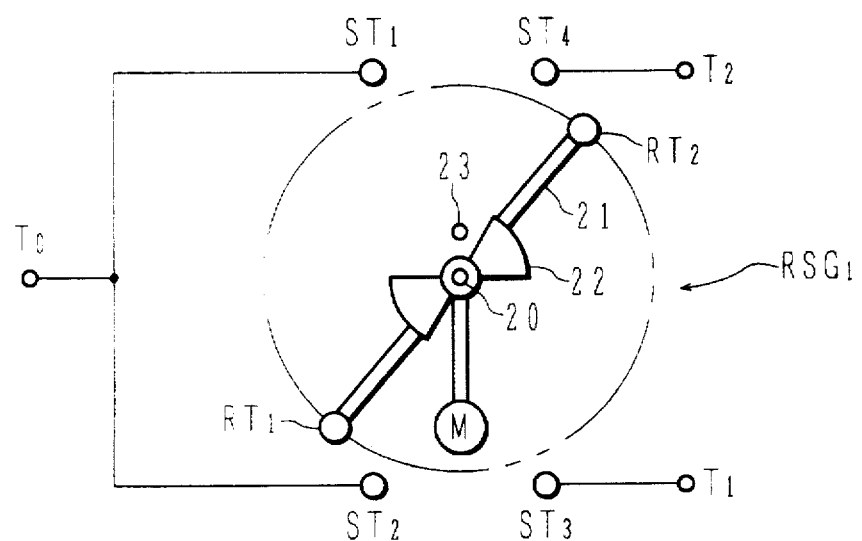
FIG. 2 is a diagram showing another example of a switch of the circuit for an electrostatic precipitator of the first embodiment.

FIG. 2 shows the structure of a rotary spark gap used in place of the switch SW shown in FIG. 1A.

This rotary spark gap $RSG_1$ has four still electrodes $ST_1$ to $ST_4$ disposed at apexes of a virtual rectangle and two rotary electrodes $RT_1$ and $RT_2$. The still electrodes $ST_1$ and $ST_2$ are connected in common to a terminal $T_O$ shown in FIG. 1A, and the still electrodes $ST_3$ and $ST_4$ are connected to the terminals $T_1$ and $T_2$ shown in FIG. 1A respectively. The two rotary electrodes $RT_1$ and $RT_2$ are interconnected by a rod member 21 and electrically shorted, the center of the rod member 21 being rotatively mounted on a rotary shaft 20. The rotary shaft 20 is disposed at the center of a rectangle having as its apexes the four still electrodes $ST_1$ to $ST_4$.

As the rotary electrodes $RT_1$ and $RT_2$ rotate about the rotary shaft 20 and come near the still electrodes, sparking occurs in the gaps between the rotary and still electrodes and these electrodes become conductive. For example, as the rotary electrodes $RT_1$ and $RT_2$ come near the still electrodes $ST_1$ and $ST_3$ respectively, short circuit is formed between the terminals $T_O$ and $T_1$. This corresponds to the case wherein the switch SW of FIG. 1A is turned to the first switch terminal $T_1$, side.

As the rotary electrodes $RT_1$ and $RT_2$ further rotate in the clockwise direction and come near the still electrodes $ST_4$ and $ST_2$, a short circuit is formed between the terminals $T_O$ and $T_2$. This corresponds to the case wherein the switch SW of FIG. 1A is turned to the second switch terminal $T_2$ side.

A sector-form light shielding plate 22 in rotation symmetry with the rotary shaft 20 is mounted on the rod member 21. A light source and a rotary electrode position detector unit 23 are disposed near the rotary shaft 20. Light radiated from the light source is received by the position detector unit 23 which in turn generates a light detection signal. The light shielding plate 22 rotates with the rotary electrodes $RT_1$ and $RT_2$ and rod member 21 to shield a light path of the rotary electrode position detector unit 23.

The light shielding plate 22 is disposed so that it shields the light path of the rotary electrode position detector unit 23 before time t1 shown in FIG. 1B, and releases the light shielding after time t4+$T_3$. Specifically, the light shielding plate 22 shields the light path of the rotary electrode position detector unit 23 before spark is generated between the electrodes as the rotary electrodes $RT_1$ and $RT_2$ come near the still electrodes $ST_1$, and $ST_3$ and releases the light shielding after a lapse of time $T_3$ after spark is generated between the electrodes as the rotary electrodes $RT_1$, and $RT_2$ come near the still electrodes $ST_4$ and $ST_2$.

An output signal from the rotary electrode position detector unit 23 is supplied to the timing controller CNT shown in FIG. 1A. The timing controller CNT makes the thyristor $S_1$ non-conductive during the period while the light path of the rotary electrode position detector unit 23 is shielded.

Figure 3A:
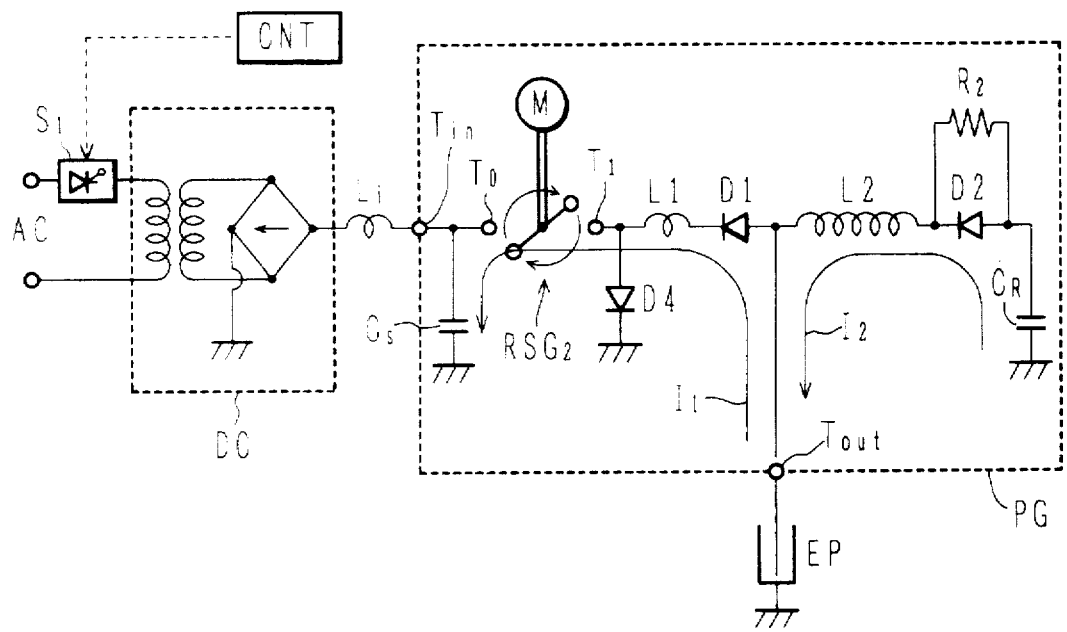
FIG. 3A shows a circuit for an electrostatic precipitator, including its peripheral circuit and a precipitating capacitor, according to a second embodiment of the invention.
Figure 3B:
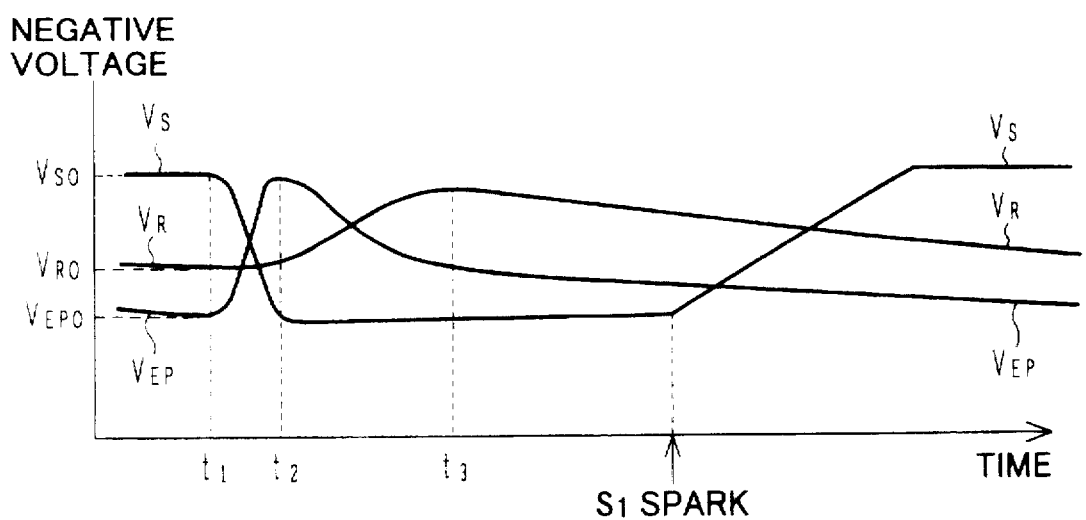
FIG. 3B is a graph showing a voltage change with time of the circuit shown in FIG. 3A.

FIG. 3A shows a circuit for an electrostatic precipitator, including its peripheral circuit and a precipitating capacitor, according to the second embodiment of the invention, and FIG. 3B is a graph showing a voltage change with time of storage, recovery, and precipitating capacitors of the circuit shown in FIG. 3A.

The electrostatic precipitator circuit PG shown in FIG. 3A is constructed by removing the LC resonance circuit I3 from the circuit PG shown in FIG. 1A and inserting a resistor $R_2$ parallel with the diode $D_2$ instead. Since the LC resonance circuit 13 is not used, a rotary spark gap $RSG_2$ having two still electrodes is used in place of the switch SW shown in FIG. 1A. The rotary spark gap $RSG_2$ is equivalent to the $RSG_1$ shown in FIG. 2 except that the still electrodes $ST_2$ and $ST_4$ are removed. The other structures are the same as those of the electrostatic precipitator circuit shown in FIG. 1A.

The diode $D_2$ shown in FIG. 3A is conductive during the period from time when the absolute value of the voltage $V_{EP}$ becomes larger than that of the voltage $V_R$ immediately after time t1 to time t3. Therefore, irrespective of a presence/absence of the resistor $R_2$, the voltages $V_S$, $V_{EP}$, and $V_R$ change in the same manner as during the period from time t1 to time t3 shown in FIG. 1B.

After time t3, as a reverse bias is generated at the diode $D_2$, negative charges in the recovery capacitor CR gradually leak via the resistor $R_2$ to the precipitating capacitor EP. Negative charges moved to the precipitating capacitor EP decreases by corona discharge. Therefore, the absolute value of the voltage $V_R$ gradually reduces. Namely, the voltage $V_{EP}$ forms a single pulse waveform during the period from time t1 to time t3 shown in FIG. 3B, and thereafter the absolute values of the voltage $V_R$ and the base voltage of $V_{EP}$ gradually reduce to provide the initial values $V_{RO}$ and $V_{EPO}$ of the next pulse.

With the electrostatic precipitator circuit PG shown in FIG. 3A, although an ideal waveform of a single pulse superposed upon a corona discharge start voltage cannot be obtained as a voltage to be applied to the precipitator electrodes, re-spark of the rotary spark gap can be prevented with a smaller number of components.

In the above embodiments, the capacitances of the storage capacitor $C_S$, precipitating capacitor EP, and recovery capacitor $C_R$ are made generally the same in order to obtain an approximately equal voltage change in each capacitor upon transfer of electric charges among them. The capacitance of the storage capacitor $C_S$ may be set to 0.9 to 1.1 times as large as the capacitance of each of the precipitating capacitor EP and recovery capacitor $C_R$.

The capacitances of the storage capacitor $C_s$, precipitating capacitor EP, and recovery capacitor $C_R$ may be set smaller in this order, that of the storage capacitor $C_S$ being set largest. If the capacitances of these capacitors are set in this manner, voltage attenuation in each capacitor can be compensated because electric charges stored in the storage capacitor $C_S$ are sequentially transferred to the precipitating capacitor EP and recovery capacitor $C_R$. However, if $|V_S|>|V_{EP}|$ is satisfied at time t3 shown in FIG. 1B, negative charges may move from the storage capacitor $C_S$ to the precipitating capacitor EP. It is therefore preferable to set each capacitance so as to satisfy $|V_S|<|V_{EP}|$ at time t3.

Figure 4A:
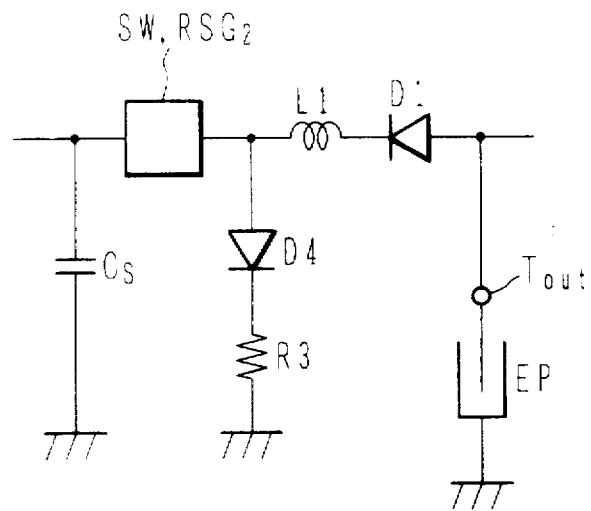
FIGS. 4A and 4B are diagrams showing parts of circuits for an electrostatic precipitator according to modifications of the first and second embodiments.

FIG. 4A is a diagram showing part of the electrostatic precipitator circuit according to a modification of the first and second embodiments. A resistor $R_3$ is serially connected to the diode $D_4$ and the other structures are the same as those of FIG. 1A or 3A. As spark is generated in the precipitating capacitor EP, electric charges in the storage capacitor $C_s$ discharge via the switch SW (in the first embodiment) or rotary spark gap $RSG_2$ (in the second embodiment), inductor $L_1$, diode $D_1$, and precipitating capacitor EP. This discharge circuit has a capacitor and an inductor so that discharge current oscillates. The storage capacitor $C_S$ may therefore be charged in a reverse polarity. The diode $D_4$ constitutes a by-pass circuit which prevents the storage capacitor $C_S$ from being charged in a reverse polarity.

The resistor $R_3$ serially connected to the diode $D_4$ suppresses an increase in current flowing through the diode $D_4$. Since the resistor $R_3$ suppresses an increase in current flowing through the diode $D_4$, a heating amount of the diode $D_4$ can be reduced. The value of the resistor $R_3$ is, for example, about 10 to 100 $\Omega$.

Figure 4B:
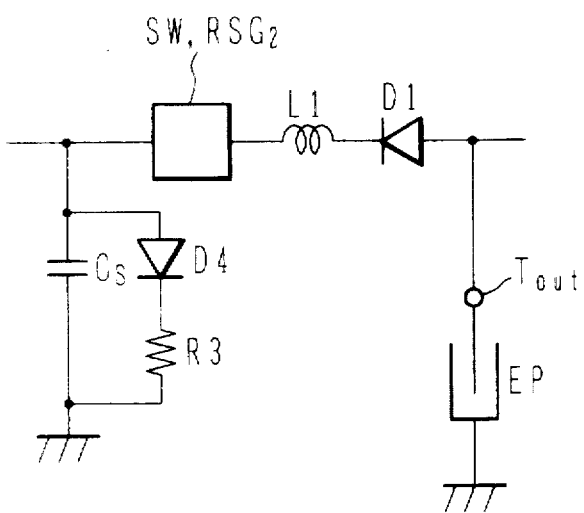
Figure 5A:
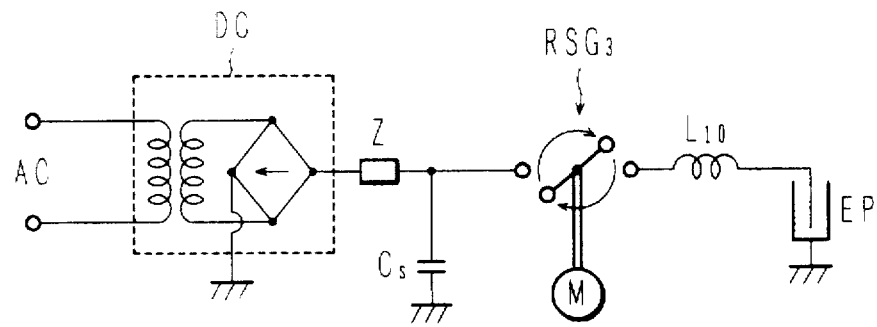
FIG. 5A shows a conventional circuit for an electrostatic precipitator, including its peripheral circuit and a precipitating capacitor.
Figure 5B:
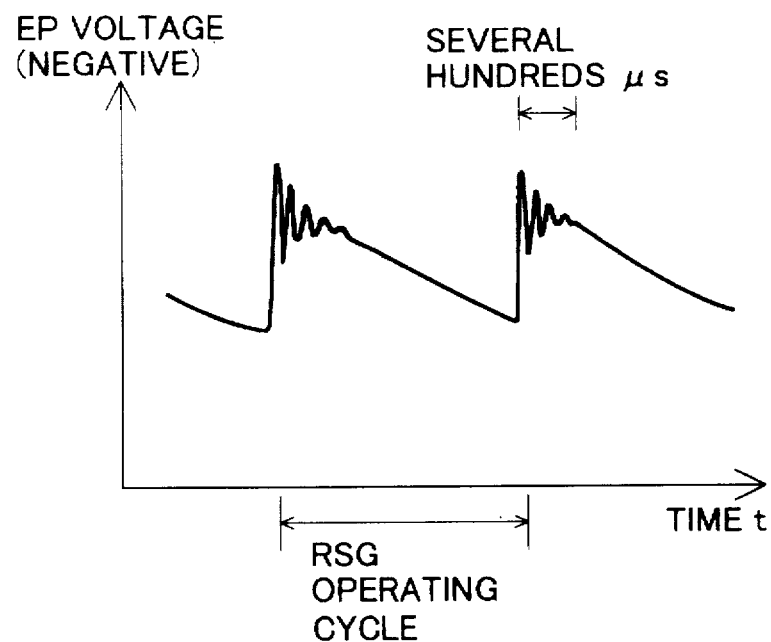
FIG. 5B is a graph showing a voltage change with time of the circuit shown in FIG. 5A.
Figure 5C:
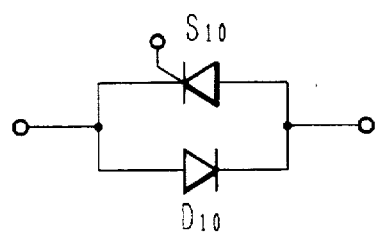
FIG. 5C is a diagram showing another example of the rotary spark gap for a conventional electrostatic precipitator.
Figure 6:
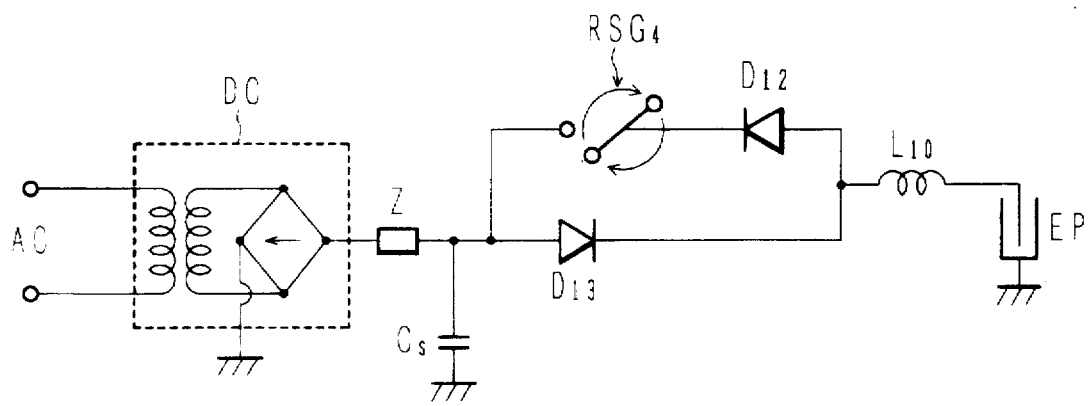
FIG. 6 shows a conventional circuit for an electrostatic precipitator, including its peripheral circuit and a precipitating capacitor.

In FIG. 4A, the serial circuit of the diode $D_4$ and resistor $R_3$ is connected between the inductor $L_1$ and the switch SW or rotary spark gap $RSG_2$. This serial circuit may be connected at any position so long as it is nearer to the storage capacitor $C_S$ than the inductor $L_1$. For example, as shown in FIG. 4B, a serial circuit of a diode D4 and a resistor $R_3$ may be connected between the non-ground electrode of the storage capacitor $C_S$ and the ground potential.

In the first and second embodiments, the half cycles $T_1$ and $T_2$ shown in FIG. 1B are set to about 10 μs and 100 μs, respectively. These half cycles may be set to other lengths of time. However, in order to obtain a sufficiently high pulse voltage of VEp, it is preferable to set the half cycle $T_2$ sufficiently longer than the half cycle $T_1$, for example, to set ten times or more the half cycle $T_1$. For example, if the capacitance of the storage capacitor $C_S$ is set about 0.9 to 1.1 times as large as that of the precipitating capacitor EP and recovery capacitor $C_R$, the induction coefficient of the inductor $L_2$ is preferably set to 100 times or more the induction coefficient of the inductor $L_1$.

If the half cycle $T_1$ is shortened to 0.5 μs or less and the half cycle $T_2$ is shortened to 5 μs or less, long streamer corona is likely to occur at the precipitating capacitor and chemically active 0 radicals, OH radicals, and the like are likely to be generated in precipitated gas. These radicals oxidize $SO_2$ in the gas to form $H_2SO_4$. $NH_3$ is introduced into the precipitated gas to neutralize $H_2SO_4$ and recover $SO_2$ as $(NH_4)_2SO_4$. As above, if relatively short pulses are used, the electrostatic precipitator may be used as a desulfurizer. For a desulfurizer, it is preferable to set the half cycle $T_1$ to 0.5 μs or shorter and the half cycle $T_2$ to 5 μs or shorter. In order to generate long streamer corona effectively, it is more preferable that the half cycle $T_1$ is shortened to 0.1 μs or less and the half cycle $T_2$ is shortened to 1 μs or less.

$H_2SO_4$ operates to lower electric resistance of precipitated dust. Therefore, back-ionization phenomenon, caused by high resistivity dust layer on the collecting electrodes of the precipitating capacitor, can be suppressed.

The present invention has been described in connection with the preferred embodiments. However, the invention is not limited only to the above embodiments, and it should be apparent to those skilled in the art that various modifications, improvements, combinations and the like can be made without departing from the scope of the appended claims.

I claim:

1. An electrostatic precipitator circuit comprising:

an input terminal to which a DC voltage is applied;

an output terminal to be connected to a precipitating capacitor having a multiple system of discharging electrodes and a multiple system of collecting electrodes;

a storage capacitor having a ground electrode applied with a ground potential and a non-ground electrode connected to said input terminal;

a recovery capacitor having a ground electrode applied with the ground potential and a non-ground electrode;

a current path switch having a common terminal and first and second switch terminals, the common terminal being connected to the non-ground electrode of said storage capacitor, and said current path switch having a first conductive state wherein the common terminal is connected to the first switch terminal, a second conductive state wherein the common terminal is connected to the second switch terminal, and a neutral state wherein the common terminal is connected to neither the first switch terminal nor the second switch terminal;

a first current path including a serial circuit of a first inductor and a first diode for connecting the first switch terminal to said output terminal;

a second current path including a serial circuit of a second inductor and a second diode for connecting said output terminal to the non-ground electrode of said recovery capacitor, a polarity of an electrode of said second diode on a side of said output terminal being opposite to a polarity of an electrode of the first diode on the side of said output terminal;

a third current path including a serial circuit of a third inductor and a third diode for connecting the non-ground electrode of said recovery capacitor to the second switch terminal, a polarity of an electrode of said third diode on a side of said recovery capacitor being opposite to a polarity of an electrode of the second diode on the side of said recovery capacitor.

2. An electrostatic precipitator circuit according to claim 1, wherein an induction coefficient of the second inductor is at least 100 times an induction coefficient of the first inductor.

3. An electrostatic precipitator circuit according to claim 1, wherein said current path comprises a rotary spark gap including:

first and second still electrodes connected to the first and second terminals, respectively;

third and fourth still electrodes connected to the common terminal; and a rotary electrode for making connection between the first and third still electrodes at a first rotary position and for making connection between the second and fourth still electrodes at a second rotary position.

4. An electrostatic precipitator circuit according to claim 1, further comprising a fourth current path connected between the ground potential and an interconnection between said first current path and the first switch terminal or the non-ground electrode of said storage capacitor, said fourth current path including a serial circuit of a fourth diode and a resistor, and the fourth diode being connected to have a polarity allowing current to flow therethrough when a potential at the non-ground electrode of said storage capacitor becomes opposite in polarity to a potential of the DC voltage applied to said input terminal.

5. An electrostatic precipitator circuit according to claim 1, further comprising a resistor having a high resistance for connecting said input terminal to said output terminal.

6. An electrostatic precipitator circuit comprising:

an input terminal to which a DC voltage is applied;

an output terminal to be connected to a precipitating capacitor;

a storage capacitor having a ground electrode applied with a ground potential and a non-ground electrode connected to said input terminal;

a recovery capacitor having a ground electrode applied with the ground potential and a non-ground electrode;

a first current path including a switch and a serial circuit of a first inductor and a first diode for connecting a non-ground electrode of said storage capacitor to said output terminal;

a second current path including a serial circuit of a second inductor and a second diode for connecting said output terminal to the non-ground electrode of said recovery capacitor, a polarity of an electrode of said second diode on a side of said output terminal being opposite to a polarity of an electrode of the first diode on the side of said output terminal; and a resistor connected in parallel to the second diode.

7. An electrostatic precipitator circuit according to claim 6, wherein an induction coefficient of the second inductor is at least 100 times an induction coefficient of the first inductor.

8. An electrostatic precipitator circuit according to claim 6, wherein said switch comprises a rotary spark gap.

9. An electrostatic precipitator circuit according to claim 6, further comprising a third current path having a first end connected to said first current path at a position nearer to said storage capacitor than the first inductor and a second end connected to the ground potential, said third current path including a serial circuit of a third diode and a resistor, and the third diode being connected to have a polarity allowing current to flow therethrough when a potential at the non-ground electrode of said storage capacitor becomes opposite in polarity to a potential of the DC voltage applied to said input terminal.

10. An electrostatic precipitator comprising:

a DC power source switched between a voltage output state and a voltage output inhibition state upon reception of an on-off control signal;

a precipitating capacitor having a multiple system of electrodes applied with a ground potential, said precipitating capacitor also having a multiple system of discharging electrodes and a multiple system of collecting electrodes;

a storage capacitor having a ground electrode applied with the ground potential and a non-ground electrode applied with an output voltage of said DC power source;

a recovery capacitor having a ground electrode applied with the ground potential;

a current path switch having a common terminal and first and second switch terminals, the common terminal being connected to the non-ground electrode of said storage capacitor, and said current path switch having a first conductive state wherein the common terminal is connected to the first switch terminal, a second conductive state wherein the common terminal is connected to the second switch terminal, and a neutral state wherein the common terminal is connected to neither the first switch terminal nor the second switch terminal;

a first current path including a serial circuit of a first inductor and a first diode for connecting the first switch terminal to a non-ground electrode of the precipitating capacitor;

a second current path including a serial circuit of a second inductor and a second diode for connecting the non-ground electrode of the precipitating capacitor to a non-ground electrode of said recovery capacitor, a polarity of an electrode of said second diode on a side of said precipitating capacitor being opposite to a polarity of an electrode of the first diode on the side of said precipitating capacitor;

a third current path including a serial circuit of a third inductor and a third diode for connecting the non-ground electrode of said recovery capacitor to the second switch terminal, a polarity of an electrode of said third diode on a side of said recovery capacitor being opposite to a polarity of an electrode of the second diode on the side of said recovery capacitor; and a control unit for
  (i) making said current path switch enter the first conductive state after making said DC power source enter the voltage output inhibition state, and
  (ii) after a lapse of a half cycle of a resonance frequency of an LC resonance circuit formed by said precipitating capacitor, said storage capacitor, and said first current path from a time when said current path switching means is made to enter the first conductive state, making said current path switch enter the neutral state, and
  (iii) after a lapse of a half cycle of a resonance frequency of an LC resonance circuit formed by said precipitating capacitor, said recovery capacitor, and said second current path from a time when said current path switching means is made to enter the neutral state, making after a lapse of some time said current path switch enter the second conductive state, and
  (iv) thereafter making said DC power source enter the voltage output state.

11. An electrostatic precipitator according to claim 10, wherein said current path switch comprises a rotary spark gap including:

first and second still electrodes connected to the first and second switch terminals, respectively;

third and fourth still electrodes connected to the common terminal; and a rotary electrode for making the first and third still electrodes connect while a rotary angle from a reference position is in a first range and for making the second and fourth still electrodes connect while the rotary angle is in a second range, and wherein said electrostatic precipitator further comprises a rotary electrode position detector for detecting a rotary angle of said rotary electrode from the reference position and for supplying a detected signal to said control means.

12. An electrostatic precipitator according to claim 11, wherein said rotary electrode position detector comprises:

a light source:

a light sensor for receiving light radiated from said light source and for supplying a light detected signal to said control unit; and a light shielding plate mounted on said rotary electrode and rotating with said rotary electrode for shielding light radiated from said light source while said rotary electrode is in a predetermined range.

13. An electrostatic precipitator according to claim 12, wherein said light shielding plate comprises a sector shape in rotation symmetry.

14. An electrostatic precipitator according to claim 10, wherein a capacitance of said storage capacitor is 0.9 to 1.1 times as large as a capacitance of said precipitating capacitor, and 0.9 to 1.1 times as large as a capacitance of said recovery capacitor.

15. An electrostatic precipitator according to claim 12, wherein an induction coefficient of the second inductor is at least 100 times an induction coefficient of the first inductor.

16. An electrostatic precipitator according to claim 10, wherein a capacitance of said precipitating capacitor is smaller than a capacitance of said storage capacitor, and a capacitance of said recovery capacitor is smaller than the capacitance of said precipitating capacitor.

17. An electrostatic precipitator according to claim 10, wherein the half cycle of the resonance frequency of the LC resonance circuit formed by said first current path, said storage capacitor, and said precipitating capacitor is less than 0.5 μs, and the half cycle of the resonance frequency of the LC resonance circuit formed by said second current path, said storage capacitor, and said precipitating capacitor is less than 5 μs.

* * * * *